United States Patent
Ye

(10) Patent No.: US 9,161,112 B2
(45) Date of Patent: Oct. 13, 2015

(54) SINGLE-WIRE PROGRAMMABLE MEMS MICROPHONE, PROGRAMMING METHOD AND SYSTEM THEREOF

(71) Applicants: SHANGHAI SNIPER MICROELECTRONICS, Shanghai (CN); ZILLTEK TECHNOLOGY CORPORATION, Xinzhu (TW)

(72) Inventor: Jinghua Ye, Xinzhu (TW)

(73) Assignees: SHANGHAI SNIPER MICROELECTRONICS, Zhangjiang Hi-Tech Park, Pudong District, Shanghai (CN); ZILLTEK TECHNOLOGY CORPORATION, Technology Garden, Xinzhu (TW)

( * ) Notice: Subject to any disclaimer, the term of this patent is extended or adjusted under 35 U.S.C. 154(b) by 343 days.

(21) Appl. No.: 13/742,789

(22) Filed: Jan. 16, 2013

(65) Prior Publication Data
US 2013/0195288 A1      Aug. 1, 2013

(30) Foreign Application Priority Data

Jan. 16, 2012   (CN) .......................... 2012 1 0011442

(51) Int. Cl.
| | |
|---|---|
| *H04R 3/00* | (2006.01) |
| *H04R 1/08* | (2006.01) |
| *H03K 19/08* | (2006.01) |
| *H04R 19/00* | (2006.01) |
| *H04R 19/04* | (2006.01) |
| *H03G 3/00* | (2006.01) |

(52) U.S. Cl.
CPC .................. *H04R 1/08* (2013.01); *H03K 19/08* (2013.01); *H04R 19/005* (2013.01); *H04R 19/04* (2013.01)

(58) Field of Classification Search
CPC .... H03G 1/0088; H04R 19/04; H04R 29/004; H04R 19/016
USPC ......................................................... 381/111
See application file for complete search history.

(56) References Cited

U.S. PATENT DOCUMENTS

2011/0064246 A1*   3/2011   Loeppert et al. .............. 381/107

* cited by examiner

*Primary Examiner* — Paul S Kim
*Assistant Examiner* — Norman Yu
(74) *Attorney, Agent, or Firm* — Global IP Services; Tianhua Gu

(57) ABSTRACT

The present invention provides a single wire programmable Micro Electromechanical System (MEMS) microphone and a programming method and system thereof. The single wire programmable MEMS microphone includes an MEMS sensor and an Application Specific Integrated Circuit (ASIC) chip connected to each other; the MEMS sensor is used for implementing acoustic-electric conversion; the ASIC chip includes an OUT interface, so that an upper computer judges, according to an output signal of the OUT interface, whether the ASIC chip is in a normal start mode or a programming mode, where if the output signal of the OUT interface is at a high level, the ASIC chip is in the normal start mode, and otherwise, the ASIC chip enters the programming mode. Through the present invention, multiplexing of the OUT interface of the MEMS microphone is implemented, and gain configuration for the OTP memory in the ASIC chip is implemented by multiplexing the OUT interface, thereby achieving calibration of the gain of the MEMS microphone product after package.

11 Claims, 3 Drawing Sheets

US 9,161,112 B2

SINGLE-WIRE PROGRAMMABLE MEMS MICROPHONE, PROGRAMMING METHOD AND SYSTEM THEREOF

CROSS REFERENCE TO RELATED PATENT APPLICATION

This application claims the priority of the Chinese patent application No. 201210011442.7 with filing date of Jan. 16, 2012, which application is incorporated herein by reference.

BACKGROUND OF THE PRESENT INVENTION

1. Field of Invention

The present invention belongs to the technical field of electronic devices, and relates to a Micro Electromechanical System (MEMS) microphone, and specifically to a single wire programmable MEMS microphone and a programming method and system thereof.

2. Description of Related Arts

A Micro Electromechanical System (MEMS) microphone is generally formed by an MEMS sensor and a signal amplification Application Specific Integrated Circuit (ASIC). The sensitivity of the MEMS microphone refers to a voltage signal obtained at an output end of the ASIC at a sound pressure of 1 Pa. The sensitivity of the MEMS microphone depends on both the sensitivity of the MEMS sensor and the gain of the ASIC. Due to the deviation in the manufacturing process, a deviation also exists for the sensitivity of the MEMS sensor. For example, for a sensor with a sensitivity of −42 dB, a deviation of ±4 dB may exist. In some application scenario, a certain requirement is put on the deviation of the sensitivity, for example, ±1 dB.

If the MEMS microphone is required to satisfy the deviation of the sensitivity of ±1 dB, a preferred implementation solution is adjusting a gain of a circuit in the ASIC. For example, a one time programmable (OTP) memory (formed by a fuse) may be integrated in the ASIC, and the gain of the circuit is changed by changing the setting of corresponding bits in the memory. Since the packaged MEMS microphone product only has AVDD, AGND, and OUT pins, no spare pins can be used for implementing the foregoing solution. Moreover, another feasible solution may be adding a dedicated programmable PAD on an ASIC chip, but in the solution, the memory is required to be configured in a wafer-level test. Although the problem of deviation of the sensitivity is solved, the limitation on application is also increased.

SUMMARY OF THE PRESENT INVENTION

In view of the disadvantages in the prior art, the objectives of the present invention are to provide a single wire programmable MEMS microphone and a programming method and system thereof. The MEMS microphone can directly configure a gain of an ASIC chip through existing encapsulated pins.

In order to achieve the foregoing and other relevant objectives, the present invention provides a single wire programmable MEMS microphone and a programming method and system thereof.

A single wire programmable MEMS microphone comprises an MEMS sensor and an ASIC chip; the MEMS sensor is used for implementing acoustic-electric conversion; the ASIC chip is connected to the MEMS sensor; the ASIC chip comprises an OUT interface, so that an upper computer judges, according to an output signal of the OUT interface, whether the ASIC chip is in a normal start mode or a programming mode, wherein if the output signal of the OUT interface is at a high level, the ASIC chip is in the normal start mode, and otherwise, the ASIC chip enters the programming mode.

In a preferred solution of the present invention, the ASIC chip comprises a main circuit module, an OTP/control circuit module, an interface circuit module, and an OTP memory; an input end of the interface circuit is connected to the OUT interface, one output end of the interface circuit is connected to the main circuit module, and the other output end of the interface circuit is connected to the OTP/control circuit module; the OTP/control circuit module is connected to the OTP memory; the interface circuit is used for controlling the main circuit module and the OTP/control circuit module to work in a programmable state or a normal working state according to a voltage of the OUT interface; and the OTP/control circuit module controls the read/write of the OTP memory.

In another preferred solution of the present invention, the interface circuit module comprises a voltage comparator, a first trigger, a second trigger, and a power-on reset circuit; the voltage comparator is connected to the OUT interface and used for comparing the voltage of the OUT interface with a reference voltage; the first trigger is connected to an output end of the voltage comparator and used for outputting an indication signal to the main circuit module; the second trigger is connected to the output end of the voltage comparator and used for outputting a control signal to the OTP/control circuit module; and the power-on reset circuit is connected respectively to the first trigger and the second trigger, and used for controlling initial values of the first trigger and the second trigger during power-on.

In yet another preferred solution of the present invention, the first trigger is a D trigger, a D input end of the D trigger is connected to the output end of the voltage comparator, and a Q output end of the D trigger is connected to an ENB end of the main circuit module.

In yet another preferred solution of the present invention, the second trigger is a D trigger, a D input end of the D trigger is connected to a power supply, a pulse input end of the D trigger is connected to the output end of the voltage comparator through an inverter, and a Q output end of the D trigger is connected to an RSTB end of the OTP/control circuit module.

A programming system for a single wire programmable MEMS microphone comprises an MEMS sensor, an ASIC chip, and an upper computer; the MEMS sensor is used for implementing acoustic-electric conversion; the ASIC chip is connected to the MEMS sensor; the ASIC chip comprises an OUT interface; the upper computer is connected to the OUT interface, and used for reading an output signal of the OUT interface, wherein if the output signal is not strongly driven into a high level, the ASIC chip is started normally; if the output signal is at the high level, the ASIC chip enters a programming mode, and the upper computer performs a write operation on the ASIC chip that enters the programming mode.

In a preferred solution of the present invention, the ASIC chip further comprises a main circuit module, an OTP/control circuit module, an interface circuit module, and an OTP memory; an input end of the interface circuit is connected to the OUT interface, one output end of the interface circuit is connected to the main circuit module, and the other output end of the interface circuit is connected to the OTP/control circuit module; the OTP/control circuit module is connected to the OTP memory; the interface circuit is used for controlling the main circuit module and the OTP/control circuit module to work in a programmable state or a normal working state according to a voltage of the OUT interface; and the OTP/control circuit module controls the read/write of the OTP memory.

In another preferred solution of the present invention, the upper computer comprises a two-way interface and a read/write control module; the two-way interface is connected to the OUT interface; the read/write control module is connected to the two-way interface; the two-way interface is connected to a power supply through a first switch; the two-way interface is grounded through a second switch; and a pull-up resistor is connected between the power supply and the two-way interface.

In yet another preferred solution of the present invention, the interface circuit module comprises a voltage comparator, a first trigger, a second trigger, and a power-on reset circuit; the voltage comparator is connected to the OUT interface and used for comparing the voltage of the OUT interface with a reference voltage; the first trigger is connected to an output end of the voltage comparator and used for outputting an indication signal to the main circuit module; the second trigger is connected to the output end of the voltage comparator and used for outputting a control signal to the OTP/control circuit module; and the power-on reset circuit is connected respectively to the first trigger and the second trigger and used for controlling initial values of the first trigger and the second trigger during power-on.

In yet another preferred solution of the present invention, the first trigger is a D trigger, a D input end of the D trigger is connected to the output end of the voltage comparator, and a Q output end of the D trigger is connected to an ENB end of the main circuit module.

In yet another preferred solution of the present invention, the second trigger is a D trigger, a D input end of the D trigger is connected to the power supply, a pulse input end of the D trigger is connected to the output end of the voltage comparator through an inverter, and a Q output end of the D trigger is connected to an RSTB end of the OTP/control circuit module.

A programming method for a single wire programmable MEMS microphone comprises the following steps:

Step 1: connecting an ASIC chip to an upper computer, and turning on a power supply;

Step 2: the upper computer reading an output signal of an OUT interface of the ASIC chip; if the output signal is not strongly driven to a high level, the ASIC chip being started normally; and if the output signal is at the high level, the ASIC chip entering a programming mode; and Step 3: the upper computer performing a write operation on the ASIC chip that enters the programming mode.

In a preferred solution of the present invention, the upper computer comprises a two-way interface connected to the OUT interface and a read/write control module connected to the two-way interface; the two-way interface is connected to the power supply through a first switch; the two-way interface is grounded through a second switch; a pull-up resistor is connected between the power supply and the two-way interface; when the first switch is turned off and the second switch is turned on, the two-way interface is weakly pulled down to a low level state; when the first switch is turned on and the second switch is turned off, the two-way interface is strongly pulled up to a high level state; and when the first switch and the second switch are both turned off, the two-way interface is weakly pulled up to a high level state.

In another preferred solution of the present invention, the ASIC chip comprises a main circuit module, an OTP/control circuit module, an interface circuit module, an OUT interface, and an OTP memory; an input end of the interface circuit is connected to the OUT interface, one output end of the interface circuit is connected to the main circuit module, and the other output end of the interface circuit is connected to the OTP/control circuit module; the OTP/control circuit module is connected to the OTP memory; the interface circuit is used for controlling the main circuit module and the OTP/control circuit module to work in a programmable state or a normal working state according to a voltage of the OUT interface; the OTP/control circuit module controls the read/write of the OTP memory; when detecting that the OUT interface is at a high level, the interface circuit outputs an indication signal to the main circuit module, to control the main circuit module to be disabled; when the OUT interface is continuously at the high level, the interface circuit outputs a control signal to control the OTP/control circuit module to reset; and when the OUT interface is at a low level, the interface circuit outputs a control signal to control the OTP/control circuit module to end resetting, and outputs an indication signal to the main circuit module to control the main circuit module to be enabled.

In yet another preferred solution of the present invention, the interface circuit module comprises a voltage comparator, a first trigger, a second trigger, and a power-on reset circuit; the voltage comparator compares the voltage of the OUT interface with a reference voltage; the first trigger outputs an indication signal to the main circuit module according to an output level of the voltage comparator, if the output level of the voltage comparator is high, the first trigger outputs a disabling indication signal to the main circuit module, and if the output level of the voltage comparator is low, the first trigger outputs an enabling indication signal to the main circuit module; the second trigger outputs a control signal to the OTP/control circuit module according to the output level of the voltage comparator, if the output level of the voltage comparator is high, the second trigger outputs a reset signal to the OTP/control circuit module, and if the output level of the voltage comparator is low, the second trigger outputs a reset ending signal to the OTP/control circuit module; and the power-on reset circuit controls initial values of the first trigger and the second trigger during power-on.

As described above, the single wire programmable MEMS microphone and the programming method and system described in the present invention have the following beneficial effects. Through the single wire programmable MEMS microphone and the programming method and system described in the present invention, multiplexing of the OUT interface of the MEMS microphone can be implemented, and gain configuration for the OTP memory in the ASIC chip can be implemented by multiplexing the OUT interface, thereby achieving calibration of the gain of the MEMS microphone product after package.

DETAILED DESCRIPTION OF THE PREFERRED EMBODIMENTS

The embodiments of the present invention are described in the following through specific examples, and those with ordinary skill in the art can easily understand other advantages and effects of the present invention according to the content disclosed in the specification. The present invention may also be implemented or applied through other different specific examples, and various modifications and variations may be made to the details in the specification on the basis of different opinions and applications without departing from the principle of the present invention.

It should be noted that, the drawings provided in the embodiments only schematically describe the basic ideas of the present invention, so the drawings only show the components related to the present invention, but are not plotted according to the number, shape and size of the components in actual implementation. The configuration, number, and proportion of the components in actual implementation may be changed at will and the layout of the components may be more complex.

The detailed implementation manners of the present invention are further described in detail below with reference to accompanying drawings.

Embodiment 1

Figure 1:
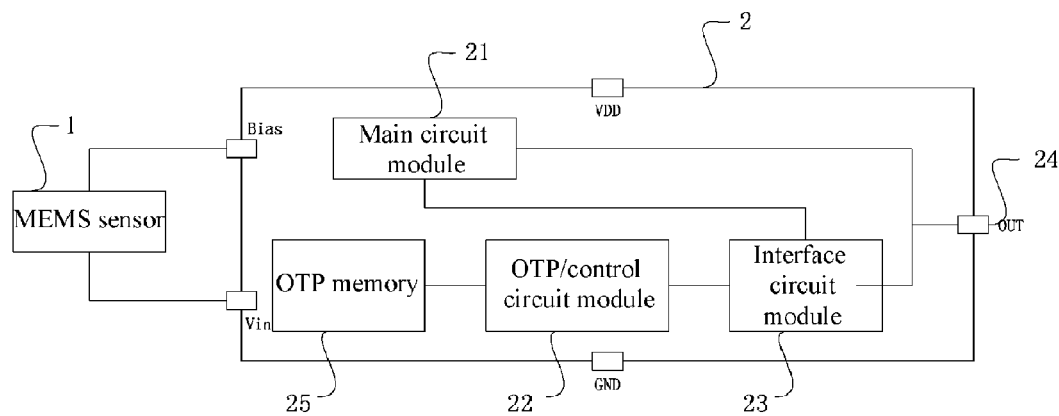
FIG. 1 is a structural block diagram of a single wire programmable MEMS microphone described in the present invention.

This embodiment provides a single wire programmable MEMS microphone. As shown in FIG. 1, the MEMS microphone includes an MEMS sensor 1 and an ASIC chip 2. The MEMS sensor 1 is connected to the ASIC chip 2.

[MEMS Sensor 1]

The MEMS sensor 1 is used for implementing acoustic-electric conversion.

[ASIC Chip 2]

The ASIC chip 2 is connected to the MEMS sensor 1. The ASIC chip 2 includes a main circuit module 21, an OTP/control circuit module 22, an interface circuit module 23, an OUT interface 24, and an OTP memory 25. An input end of the interface circuit 23 is connected to the OUT interface 24, one output end of the interface circuit is connected to the main circuit module 21, and the other output end of the interface circuit is connected to the OTP/control circuit module 22. The interface circuit 23 is used for controlling the main circuit module 21 and the OTP/control circuit module 22 to work in a programmable state or a normal working state according to a voltage of the OUT interface 24. The OTP memory 25 is connected to the OTP/control circuit module 22, and the OTP/control circuit module 22 controls the read/write of contents in the OTP memory 25. The ASIC chip may enable an upper computer to judge, according to an output signal of the OUT interface, whether the ASIC chip is in a normal start mode or a programming mode, where if the output signal of the OUT interface is at a high level, the ASIC chip is in the normal start mode, and otherwise, the ASIC chip enters the programming mode.

Figure 2:
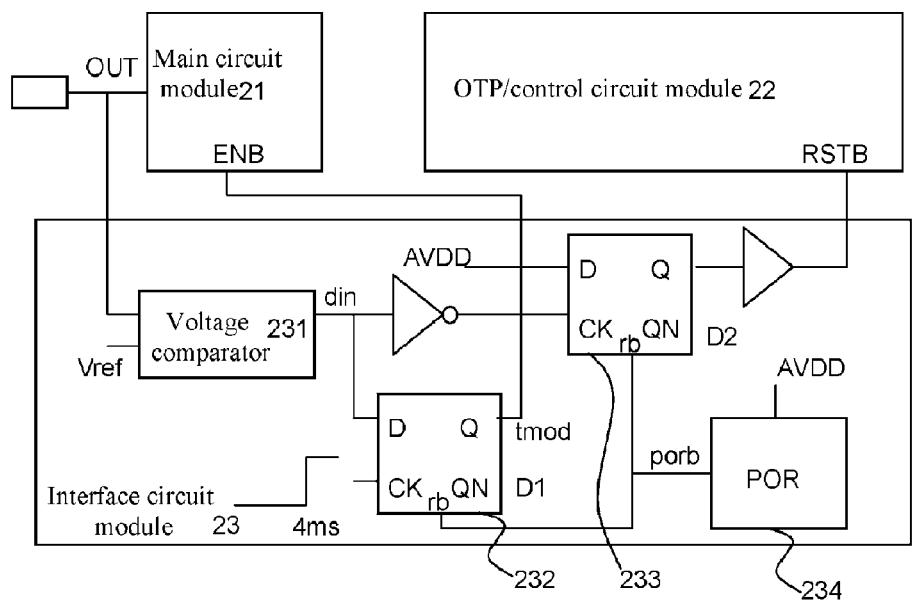
FIG. 2 is a structural block diagram of an interface circuit module of a single wire programmable MEMS microphone described in the present invention.

As shown in FIG. 2, the interface circuit module 23 includes a voltage comparator 231, a first trigger 232, a second trigger 233, and a power-on reset circuit 234. The voltage comparator 231 is connected to the OUT interface 24 and used for comparing the voltage of the OUT interface with a reference voltage. The first trigger 232 is connected to an output end of the voltage comparator 231 and used for outputting an indication signal to the main circuit module 21. The second trigger 233 is connected to the output end of the voltage comparator 231 and used for outputting a control signal to the OTP/control circuit module 22. The power-on reset circuit 234 is connected respectively to the first trigger 232 and the second trigger 233 and used for controlling initial values of the first trigger and the second trigger during power-on. The interface circuit module implements the multiplexing of an output pin (that is, the OUT interface), so that the ASIC chip can enter and exit the programmable state. The interface circuit module can complete a read/write operation on the OTP memory in the chip according to a set timing.

The first trigger 232 may be a D trigger. A D input end of the D trigger is connected to the output end of the voltage comparator, and a Q output end of the D trigger is connected to an ENB end of the main circuit module.

The second trigger 233 may also be a D trigger. A D input end of the D trigger is connected to a power supply, a pulse input end of the D trigger is connected to the output end of the voltage comparator through an inverter, and a Q output end of the D trigger is connected to an RSTB end of the OTP/control circuit module.

Through the single wire programmable MEMS microphone described in the present invention, gain configuration for the OTP memory in the ASIC chip can be implemented by multiplexing the output (OUT) pin, thereby achieving calibration of the MEMS microphone product after package.

Embodiment 2

Figure 3:
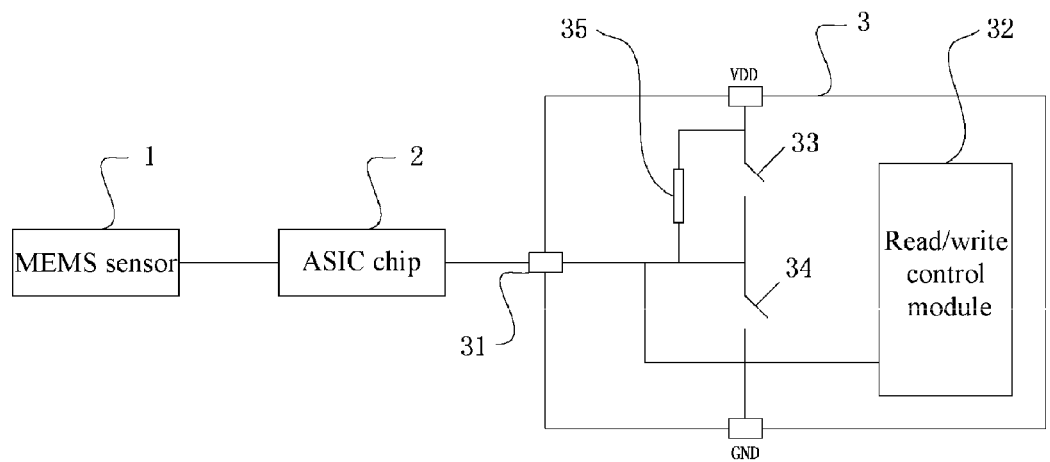
FIG. 3 is a structural block diagram of a programming system for a single wire programmable MEMS microphone described in the present invention.

This embodiment provides a programming system for a single wire programmable MEMS microphone. As shown in FIG. 3, the programming system for the single wire programmable MEMS microphone includes an MEMS sensor 1, an ASIC CHIP 2, and an upper computer 3.

[MEMS Sensor 1]

The MEMS sensor 1 is used for implementing acoustic-electric conversion.

[ASIC Chip 2]

As shown in FIG. 1, the ASIC chip 2 is connected to the MEMS sensor 1. The ASIC chip 2 includes a main circuit module, an OTP/control circuit module, an interface circuit module, and an OUT interface. An input end of the interface circuit is connected to the OUT interface, one output end of the interface circuit is connected to the main circuit module, and the other output end of the interface circuit is connected to the OTP/control circuit module. The interface circuit is used for controlling the main circuit module and the OTP/control circuit module to work in a programmable state or a normal working state according to a voltage of the OUT interface. The upper computer is connected to the OUT interface and used for performing a read/write operation on the ASIC chip. The upper computer reads an output signal of the OUT interface, where if the output signal is not strongly driven into a high level, the ASIC chip is started normally; if the output signal is at the high level, the ASIC chip enters a programming mode, and the upper computer performs a write operation on the ASIC chip that enters the programming mode.

As shown in FIG. 2, the interface circuit module 23 includes a voltage comparator 231, a first trigger 232, a second trigger 233, and a power-on reset circuit 234. The voltage comparator 231 is connected to the OUT interface 24 and used for comparing the voltage of the OUT interface with a reference voltage. The first trigger 232 is connected to an output end of the voltage comparator 231 and used for outputting an indication signal to the main circuit module 21. The second trigger 233 is connected to the output end of the voltage comparator 231 and used for outputting a control signal to the OTP/control circuit module 22. The power-on reset circuit 234 is connected respectively to the first trigger 232 and the second trigger 233 and used for controlling initial values of the first trigger and the second trigger during power-on. The interface circuit module implements the multiplexing of an output pin (that is, the OUT interface), so that the ASIC chip can enter and exit the programmable state. The interface circuit module can complete a read/write operation on the OTP memory in the chip according to a set timing.

The first trigger 232 may be a D trigger. A D input end of the D trigger is connected to an output end of the voltage comparator, and a Q output end of the D trigger is connected to an ENB end of the main circuit module.

The second trigger 233 may also be a D trigger. A D input end of the D trigger is connected to a power supply, a pulse input end of the D trigger is connected to the output end of the voltage comparator through an inverter, and a Q output end of the D trigger is connected to an RSTB end of the OTP/control circuit module.

[Upper Computer 3]

As shown in FIG. 3, the upper computer 3 includes a two-way interface 31 and a read/write control module 32. The two-way interface 31 is connected to the OUT interface 24. The read/write control module 32 is connected to the two-way interface 31. The two-way interface 31 is connected to the power supply through a first switch 33. The two-way interface 31 is grounded through a second switch 34. A pull-up resistor 35 is connected between the power supply and the two-way interface 31.

FIG. 3 shows a method for connecting the ASIC chip to the upper computer in the present invention. The two-way interface of the upper computer is connected to the ASIC chip. A switch (that is, the first switch) connected to the power supply is used for generating a strong pull-up signal, and a switch (that is, the second switch) connected to the ground is used for generating a pull-down signal. When the two switches are both in an off state, an output pin (that is, the two-way interface) is connected to the power supply through the pull-up resistor. In this case, the pin is in a weak pull-up state. Furthermore, the state of the pin is directly read into the read/write control module by a read path.

Embodiment 3

This embodiment provides a programming method for a single wire programmable MEMS microphone. The method includes the following steps.

Step 1: Connect an ASIC chip to an upper computer, and turn on a power supply.

Step 2: The upper computer reads an output signal of an OUT interface of the ASIC chip; if the output signal is not strongly driven to a high level, the ASIC chip is started normally; and if the output signal is at the high level, the ASIC chip enters a programming mode. In this step, specific implementation processes of the upper computer and the ASIC chip are as follows.

The upper computer includes a two-way interface connected to the OUT interface and a read/write control module connected to the two-way interface. The two-way interface is connected to the power supply through a first switch. The two-way interface is grounded through a second switch. A pull-up resistor is connected between the power supply and the two-way interface. When the first switch is turned off and the second switch is turned on, the two-way interface is weakly pulled down to a low level state. When the first switch is turned on and the second switch is turned off, the two-way interface is strongly pulled up to a high level state. When the first switch and the second switch are both turned off, the two-way interface is weakly pulled up to a high level state.

The ASIC chip includes a main circuit module, an OTP/control circuit module, an interface circuit module, and an OUT interface. An input end of the interface circuit is connected to the OUT interface, one output end of the interface circuit is connected to the main circuit module, and the other output end of the interface circuit is connected to the OTP/control circuit module. The interface circuit is used for controlling the main circuit module and the OTP/control circuit module to work in a programmable state or a normal working state according to a voltage of the OUT interface. When detecting that the OUT interface is at a high level, the interface circuit outputs an indication signal to the main circuit module, to control the main circuit module to be disabled. When the OUT interface is continuously at the high level, the interface circuit outputs a control signal to control the OTP/control circuit module to reset. When the OUT interface is at a low level, the interface circuit outputs a control signal to control the OTP/control circuit module to end resetting, and outputs an indication signal to the main circuit module to control the main circuit module to be enabled.

The interface circuit module includes a voltage comparator, a first trigger, a second trigger, and a power-on reset circuit. The voltage comparator compares the voltage of the OUT interface with a reference voltage. The first trigger outputs an indication signal to the main circuit module according to an output level of the voltage comparator. If the output level of the voltage comparator is high, the first trigger outputs a disabling indication signal to the main circuit module. If the output level of the voltage comparator is low, the first trigger outputs an enabling indication signal to the main circuit module. The second trigger outputs a control signal to the OTP/control circuit module according to the output level of the voltage comparator. If the output level of the voltage comparator is high, the second trigger outputs a reset signal to the OTP/control circuit module. If the output level of the voltage comparator is low, the second trigger outputs a reset ending signal to the OTP/control circuit module. The power-on reset circuit controls initial values of the first trigger and the second trigger during power-on.

FIG. 2 shows a specific work method of the interface circuit module. In order to make the chip enter the programming mode, a strong driving high level is applied to the pin when the chip is powered on, and the comparator detects the level signal. A reference threshold may be set according to a specific chip. At a time point, 4 ms here, when the chip is started up, the D trigger D1 collects the signal. If the output is high, the chip enters the programmable mode. An output TMOD signal is an indication signal and is used for controlling the main circuit in the chip. When TMOD is 1, the main circuit is disabled by controlling an ENB pin of the main circuit. In this case, output of the main circuit is in a high impedance state, thereby preventing the chip from working abnormally. When din is continuously high, the interface circuit resets the OTP/control circuit by controlling an RSTB interface of the OTP/control circuit, and when din declines, the resetting is ended. The power-on reset circuit (POR) is used for controlling an initial value of the D trigger during power-on. If the output of the comparator is low, the chip continues the starting process, and does not enter the programming state. Since a rising edge of CK only occurs once during starting, whether the chip enters the programmable state is determined by the level of the pin at the rising edge of CK.

Step 3: The upper computer performs a write operation on the ASIC chip that enters the programming mode.

Figure 4:
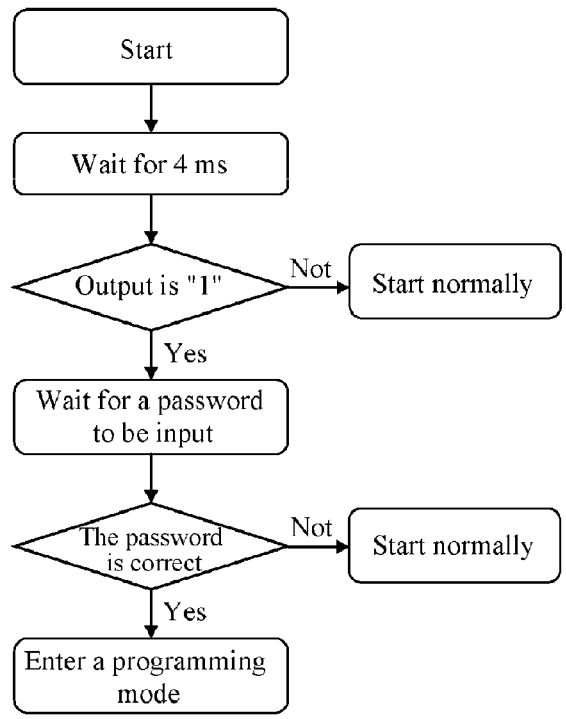
FIG. 4 is a flow chart of a single wire programmable MEMS microphone entering a programmable mode described in the present invention.

FIG. 4 is a flow chart of entering a programming mode. 4 ms after the chip is powered on, an output signal is detected. If the output is not strongly driven to a high level, the chip is started normally and does not enter the programming mode. If the output is at the high level, the chip waits for a password to be input. That is, sequence detection is performed. If the password is incorrect, the chip does not enter the programming mode. If the password is incorrect, the chip directly enters the programming mode.

Figure 5:
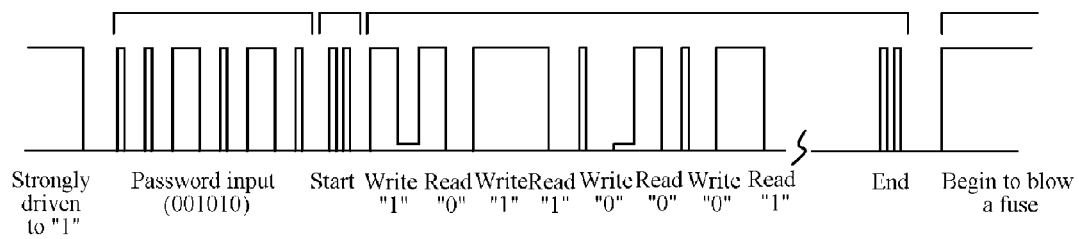
FIG. 5 is a typical power-on timing diagram.

FIG. 5 is a typical power-on timing diagram. Except that a high level during power-on is a strong driving signal, other high levels are weak pull-up signals. At this time, the chip is in a high resistance sate with respect to an OUT pin. "1" is represented by a long pulse longer than a certain time (10 microseconds), and "0" is represented by a short pulse shorter than a certain time (10 microseconds). After the password is input, two following successive short pulses represent a start signal for writing bits. Each time a bit is written, the chip selects whether to pull down the pin according to a value of a corresponding register. If the value is "1", the pin is not pulled down; or otherwise, the pin is pulled down. Meanwhile, the upper computer detects the value, that is, a state of the register. This is a process of reading a bit. After the write operation on all bits is completed, two successive short pulses represent an ending signal. Finally, the upper computer generates a high level with an arbitrary length, that is, a time for blowing a fuse. In order to ensure an adequate programming current, "1" is written for only one bit at one time.

Therefore, the present invention effectively overcomes the disadvantages in the prior art and has a high application value in industry.

The foregoing embodiments merely exemplarily describe the principle and efficacy of the present invention and are not intended to limit the present invention. Any person skilled in the art can modify or change the embodiments without departing from the spirit and scope of the present invention. Therefore, all equivalent modifications and variations made by persons of ordinary skill in the art without departing from the spirit and technical conception disclosed in the present invention still should be covered by the claims of the present invention.

What is claimed is:

1. A single wire programmable Micro Electromechanical System (MEMS) microphone comprising:
an MEMS sensor for implementing acoustic-electric conversion;
an Application Specific Integrated Circuit (ASIC) chip, which is connected to the MEMS sensor, the ASIC chip comprises an OUT interface;
the ASIC chip comprises a main circuit module, a one time programmable (OTP)/control circuit module, an interface circuit module, and an OTP memory, an input end of the interface circuit is connected to the OUT interface, one output end of the interface circuit is connected to the main circuit module, and other output end of the interface circuit is connected to the OTP/control circuit module, the OTP/control circuit module is connected to the OTP memory, the interface circuit is used for controlling the main circuit module and the OTP/control circuit module to work in a programmable state or a normal working state according to a voltage of the OUT interface, and the OTP/control circuit module controls the read/write of the OTP memory; and
when output signal of the OUT interface is not strongly driven into a high level, the ASIC chip is started normally, when output signal of the OUT interface is at the high level, the ASIC chip enters a programming mode.

2. The single wire programmable MEMS microphone as in claim 1, wherein the interface circuit module comprises:
a voltage comparator, connected to the OUT interface and used for comparing the voltage of the OUT interface with a reference voltage;
a first trigger, connected to an output end of the voltage comparator and used for outputting an indication signal to the main circuit module;
a second trigger, connected to the output end of the voltage comparator and used for outputting a control signal to the OTP/control circuit module; and
a power-on reset circuit, connected respectively to the first trigger and the second trigger and used for controlling initial values of the first trigger and the second trigger during power-on.

3. The single wire programmable MEMS microphone as in claim 2, wherein the first trigger is a D trigger, a D input end of the D trigger is connected to the output end of the voltage comparator, and a Q output end of the D trigger is connected to an ENB end of the main circuit module.

4. The single wire programmable MEMS microphone as in claim 2, wherein the second trigger is a D trigger, a D input end of the D trigger is connected to a power supply, a pulse input end of the D trigger is connected to the output end of the voltage comparator through an inverter, and a Q output end of the D trigger is connected to an RSTB end of the OTP/control circuit module.

5. A programming system for the single wire programmable Micro Electromechanical System (MEMS) microphone comprising:
an MEMS sensor, used for implementing acoustic-electric conversion;
an Application Specific Integrated Circuit (ASIC) chip, which is connected to the MEMS sensor, comprising an OUT interface;
the ASIC chip comprises a main circuit module, a one time programmable (OTP)/control module, an interface circuit module, and an OTP memory, an input end of the interface circuit is connected to the OUT interface, one output end of the interface circuit is connected to the main circuit module, and other output end of the interface circuit is connected to the OTP/control circuit module, the OTP/control circuit module is connected to the OTP memory, the interface circuit is used for controlling the main circuit module and the OTP/control circuit module to work in a programmable state or a normal working state according to a voltage of the OUT interface, and the OTP/control circuit module controls the read/write of the OTP memory; and
an upper computer connected to the OUT interface and used for reading an output signal of the OUT interface, when the output signal is not strongly driven into a high level, the ASIC chip is started normally; when the output signal is at the high level, the ASIC chip enters a programming mode, and the upper computer performs a write operation on the ASIC chip that enters the programming mode;
the upper computer comprises a two-way interface connected to the OUT interface; and a read/write control module connected to the two-way interface, wherein the two-way interface is connected to a power supply through a first switch, the two-way interface is grounded throuqh a second switch, and a pull-up resistor is connected between the power supply and the two-way interface.

6. The programming system for the single wire programmable MEMS microphone as in claim 5, wherein the interface circuit module comprises:
a voltage comparator, connected to the OUT interface and used for comparing the voltage of the OUT interface with a reference voltage;

a first trigger, connected to an output end of the voltage comparator and used for outputting an indication signal to the main circuit module;

a second trigger, connected to the output end of the voltage comparator and used for outputting a control signal to the OTP/control circuit module; and a power-on reset circuit, connected respectively to the first trigger and the second trigger and used for controlling initial values of the first trigger and the second trigger during power-on.

7. The programming system for the single wire programmable MEMS microphone as in claim 6, wherein the first trigger is a D trigger, a D input end of the D trigger is connected to the output end of the voltage comparator, and a Q output end of the D trigger is connected to an ENB end of the main circuit module.

8. The programming system for the single wire programmable MEMS microphone as in claim 7, wherein the second trigger is a D trigger, a D input end of the D trigger is connected to the power supply, a pulse input end of the D trigger is connected to the output end of the voltage comparator through an inverter, and a Q output end of the D trigger is connected to an RSTB end of the OTP/control circuit module.

9. A programming method for the single wire programmable Micro Electromechanical System (MEMS) microphone comprising:

step 1: connecting an Application Specific Integrated Circuit (ASIC) chip to an upper computer, and turning on a power supply;

step 2: the upper computer reading an output signal of an OUT interface of the ASIC chip; when the output signal is not strongly driven into a high level, the ASIC chip being started normally; and when the output signal is at the high level, the ASIC chip entering a programming mode; and step 3: the upper computer performing a write operation on the ASIC chip that enters the programming mode;

wherein the upper computer comprises a two-wav interface connected to the OUT interface and a read/write control module connected the two-way interface; the two-way interface is connected to the power supply through a first switch, the two-way interface grounded through a second switch, and pull-up resistor is connected between the power supply and the two-way interface;

when the first switch is turned off and the second switch is turned on, the two-wav interface weakly pulled down to a low level state;

when the first switch is turned on and the second switch is turned off, the two-way interface is strongly pulled up to a high level state; and when the first switch and the second switch are both turned off,the two-way interface is weakly pulled up to a high level state.

10. The programming method for the single wire programmable MEMS microphone as in claim 9, wherein the ASIC chip further comprises a main circuit module, a one time programmable (OTP)/control circuit module, an interface circuit module, and an OTP memory; wherein an input end of the interface circuit is connected to the OUT interface, one output end of the interface circuit is connected to the main circuit module, and the other output end of the interface circuit is connected to the OTP/control circuit module; the OTP/control circuit module is connected to the OTP memory; the interface circuit is used for controlling the main circuit module and the OTP/control circuit module to work in a programmable state or a normal working state according to a voltage of the OUT interface; and the OTP/control circuit module controls the read/write of the OTP memory;

when detecting that the OUT interface is at a high level, the interface circuit outputs an indication signal to the main circuit module, to control the main circuit module to be disabled; and when the OUT interface is continuously at the high level, the interface circuit outputs a control signal to control the OTP/control circuit module to reset; and when the OUT interface is at a low level, the interface circuit outputs a control signal to control the OTP/control circuit module to end resetting, and outputs an indication signal to the main circuit module to control the main circuit module to be enabled.

11. The programming method for the single wire programmable MEMS microphone as in claim 10, wherein the interface circuit module comprises a voltage comparator, a first trigger, a second trigger, and a power-on reset circuit;

the voltage comparator compares the voltage of the OUT interface with a reference voltage;

the first trigger outputs an indication signal to the main circuit module according to an output level of the voltage comparator; if the output level of the voltage comparator is high, the first trigger outputs a disabling indication signal to the main circuit module; and if the output level of the voltage comparator is low, the first trigger outputs an enabling indication signal to the main circuit module;

the second trigger outputs a control signal to the OTP/control circuit module according to the output level of the voltage comparator; if the output level of the voltage comparator is high, the second trigger outputs a reset signal to the OTP/control circuit module; and if the output level of the voltage comparator is low, the second trigger outputs a reset ending signal to the OTP/control circuit module; and the power-on reset circuit controls initial values of the first trigger and the second trigger during power-on.

* * * * *